United States Patent
Miguelez et al.

[19]

[11] Patent Number: 6,107,877
[45] Date of Patent: Aug. 22, 2000

[54] PREDISTORTION GENERATOR COUPLED WITH AN RF AMPLIFIER

[75] Inventors: Philip Miguelez, Warminster; Rudolph Menna, Harleysville; Shutong Zhou, Lansdale; Timothy Cope, Emmaus, all of Pa.

[73] Assignee: General Instrument Corporation, Horsham, Pa.

[21] Appl. No.: 09/288,906

[22] Filed: Apr. 9, 1999

[51] Int. Cl.[7] ............................... H03F 1/00; H03F 1/26
[52] U.S. Cl. ............................... 330/66; 330/149
[58] Field of Search ................... 330/65, 66, 67, 330/68, 149

[56] References Cited

U.S. PATENT DOCUMENTS

| | | | |
|---|---|---|---|
| 5,568,087 | 10/1996 | Gatti | 330/149 |
| 5,703,530 | 12/1997 | Sato et al. | 330/149 |
| 5,798,854 | 8/1998 | Blauvelt et al. | 359/161 |
| 5,909,642 | 6/1999 | Suzuki | 455/114 |

*Primary Examiner*—Robert Pascal
*Assistant Examiner*—Patricia T. Nguyen
*Attorney, Agent, or Firm*—Volpe and Koenig, P.C.

[57] ABSTRACT

An in-line distortion generator is coupled to an RF amplifier on a single PC board for producing an output signal of useful amplitude but with low composite triple beat and cross modulation distortions. The backplane under the section of the PC board upon which the distortion circuit resides is removed and the portion of the heat sink under the removed portion of the backplane is also removed. This eliminates any parasitic capacitances that could degrade the performance of the RF amplifier, thereby making the distortion circuit transparent to the RF amplifier. Furthermore, the layout of the predistortion circuitry has been specifically designed to enhance the performance of the circuitry without inducing any negative operating characteristics on the associated RF amplifier.

18 Claims, 10 Drawing Sheets

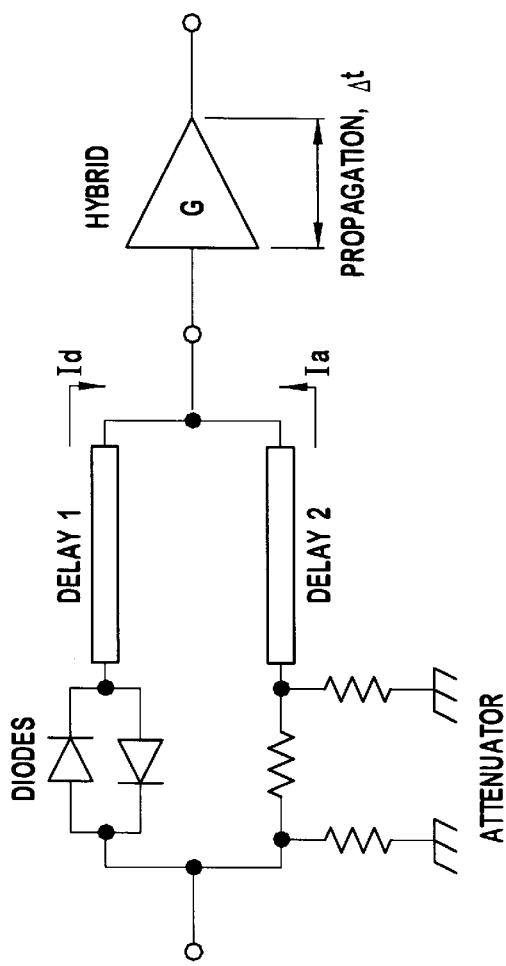
FIG. 1
PRIOR ART
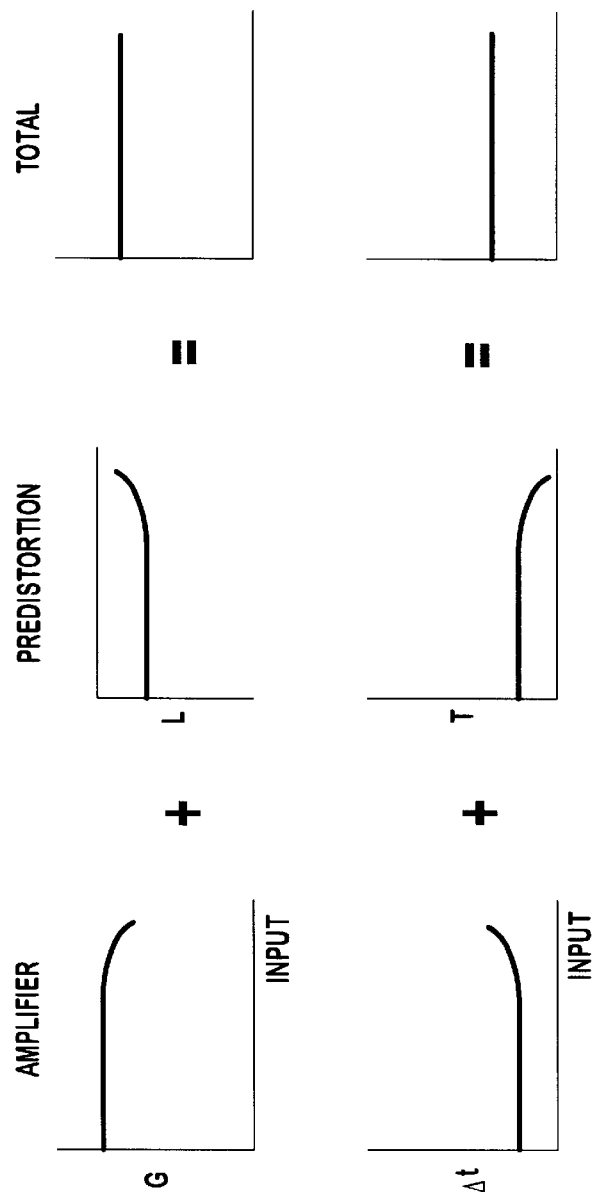
FIG. 2
PRIOR ART
FIG. 3
PRIOR ART

PREDISTORTION GENERATOR COUPLED WITH AN RF AMPLIFIER

BACKGROUND OF THE INVENTION

1. Field of the Invention

This invention relates generally to radio frequency (RF) amplification. More particularly, the invention relates to a predistortion generator coupled with an RF amplifier on a single printed circuit board.

2. Description of the Related Art

Lowering distortion in RF power amplifier circuits without compromising their transient response is an omnipresent problem. High frequency amplification is widely used in communications and broadcasting and also where high-speed switching is required for use in digital instrumentation. However, high frequency amplifier applications extend linear operation into areas where parasitic effects of inter-electrode capacitance, wire inductance, stored charge and even operating frequency wavelength begin to adversely affect and dominate circuit behavior.

Minimizing distortion is particularly important when a series of amplifiers is cascaded over a signal transmission path, such as a series of RF amplifiers in a CATV transmission system. Disposed throughout a CATV transmission system are RF amplifiers that periodically amplify the transmitted signals to counteract cable attenuation and attenuation caused by passive CATV components, such as signal splitters and equalizers. The RF amplifiers are also employed to maintain the desired carrier-to-noise ratio. Due to the number of RF amplifiers employed in a given CATV transmission system, each RF amplifier must provide minimum degradation to the transmitted signal.

Many amplifiers are subject to a wide range of ambient operating temperatures. These temperature changes may affect the operating characteristics of certain electronic components within the amplifier, thereby inducing additional distortions. A temperature range of −40° C. to +85° C. is not uncommon for many amplifier applications in a communication environment. To ensure consistent performance over the operating bandwidth, and to minimize resulting distortions, an amplifier must be designed for a broad range of ambient operating temperatures.

The distortions created by an amplifier which are of primary concern are second (even) and third (odd) order harmonic intermodulation and distortions. Prior art amplifier designs have attempted to ameliorate the effects of even order distortions by employing push-pull amplifier topologies, since the maximum even order cancellation occurs when the proper 180° phase relationship is maintained over the entire bandwidth. This is achieved through equal gain in both push-pull halves by matching the operating characteristics of the active devices.

However, odd-order distortion is difficult to remedy. Odd-order distortion characteristics of an amplifier are manifest as cross modulation (X-mod) and composite triple beat (CTB) distortions on the signal being amplified. X-mod occurs when the modulated contents of one channel being transmitted interferes with and becomes part of an adjacent or non-adjacent channel. CTB results from the combination of three frequencies of carriers occurring in the proximity of each carrier since the carriers are typically equally spaced across the frequency bandwidth. Of the two noted distortions, CTB becomes more problematic when increasing the number of channels on a given CATV system. While X-mod distortion also increases in proportion to the number of channels, the possibility of CTB is more dramatic due to the increased number of available combinations from among the total number of transmitted channels. As the number of channels transmitted by a communication system increases, or the channels reside close together, the odd-order distortion becomes a limiting factor of amplifier performance.

There are three basic ways of correcting distortion created by a non-linear device (NLD): 1) reduce the signal power level; 2) use a feed forward technique; and 3) use a predistortion or postdistortion technique. The first method reduces the signal power level such that the NLD is operating in its linear region. However, in the case of an RF amplifier this results in very high power consumption for low RF output power.

The second method is the feed forward technique. Using this technique, the input signal of the main amplification circuit is sampled and compared to the output signal to determine the difference between the signals. From this difference, the distortion component is extracted. This distortion component is then amplified by an auxiliary amplification circuit and combined with the output of the main amplification circuit such that the two distortion components cancel each other. Although this improves the distortion characteristics of the amplifier, the power consumed by the auxiliary amplification circuit is comparable to that consumed by the main amplification circuit. This circuitry is also complex and very temperature sensitive.

The third method is the predistortion or postdistortion technique. Depending upon whether the compensating distortion signal is generated before the non-linear device or after, the respective term predistortion or postdistortion is used. In this technique, a distortion signal equal in amplitude but opposite in phase to the distortion component generated by the amplifier circuit is estimated and generated. This is used to cancel the distortion at the input (for predistortion) or output (for postdistortion) of the amplifier, thereby improving the operating characteristics of the amplifier.

One distortion design, as disclosed in U.S. Pat. No. 5,703,530 and shown in FIG. 1, relies upon a traditional π-attenuation network and a delay line for gain compensation; and a diode pair coupled with a delay line for distortion and phase compensation. This circuit generates a distortion that is equal in amplitude but opposite in phase to the distortion introduced by the amplifier. Plots of the distortions contributed by the distortion generator and the distortions manifest by the amplifier are shown in FIGS. 2 and 3. As shown, the distortion signal compensates for the distortions generated by the amplifier. However, the use of delay lines in such a manner is impractical since delay lines are physically large, are difficult to adjust and the results are inconsistent across a wide frequency range. Additionally, both amplitude and phase information are required for correct compensation. The '530 patent also states that the system disclosed therein is not ideal for certain applications, such as distortion for CATV RF amplifiers, due to the excessive losses introduced by the distortion circuit.

Since a frequency response, which is flat within ±0.25dB over 50–1000 MHz, is required of a CATV RF amplifier carrying over 150 channels, special attention must be paid not only to the high-frequency characteristics of the electronic components used in the RF amplifier design, but also to the layout and packaging techniques as well. One important aspect that has serious impact on high speed and high frequency circuits is the existence of parasitic capacitance within the circuit. The subtle effects of capacitance witnessed at low frequencies often dominate circuit behavior at high frequencies.

Although it is paramount to eliminate distortions caused by RF amplifiers, most RF amplifier designs have succeeded in only reducing the distortions, not eliminating distortions. Accordingly, a separate circuit to compensate for these distortions is usually required. Coupling a distortion circuit to the associated RF amplifier on the same PC board is an option that is not typically pursued since it creates additional problems. Namely, parasitic capacitance of the distortion circuit components on the PC board causes degradation in the return loss and bandwidth performance of the RF amplifier. Accordingly, the performance of the RF amplifier is compromised.

Accordingly, there exists a need for an integrated distortion generator which is coupled with an RF amplifier on a single PC board without degrading the performance characteristics of the RF amplifier.

SUMMARY OF THE INVENTION

The present invention comprises an in-line distortion generator coupled to an RF amplifier on a single PC board for producing an output signal of useful amplitude but with low composite triple beat and cross modulation distortions. The backplane under the section of the PC board upon which the distortion circuit resides is removed and the portion of the heat sink under the removed portion of the backplane is also removed. This eliminates any parasitic capacitances that could degrade the performance of the RF amplifier, thereby making the distortion circuit transparent to the RF amplifier. Furthermore, the layout of the predistortion circuitry has been specifically designed to enhance the performance of the circuitry without inducing any negative operating characteristics on the associated RF amplifier.

Accordingly, it is an object of the invention to provide an RF amplifier coupled with a distortion generator on the same printed circuit board without degrading the performance of the RF amplifier.

Other objects and advantages of the system and the method will become apparent to those skilled in the art after reading a detailed description of the preferred embodiment.

BRIEF DESCRIPTION OF THE DRAWINGS

FIG. 1 is a schematic diagram of a prior art distortion generator.

FIG. 2 is a combination plot of the effect of using the outputs from the prior art distortion generator shown in FIG. 1 with an RF amplifier.

FIG. 3 is a combination plot of the effect of using the outputs from the prior art distortion generator shown in FIG. 1 with an RF amplifier.

DESCRIPTION OF THE PREFERRED EMBODIMENTS

Figure 4:
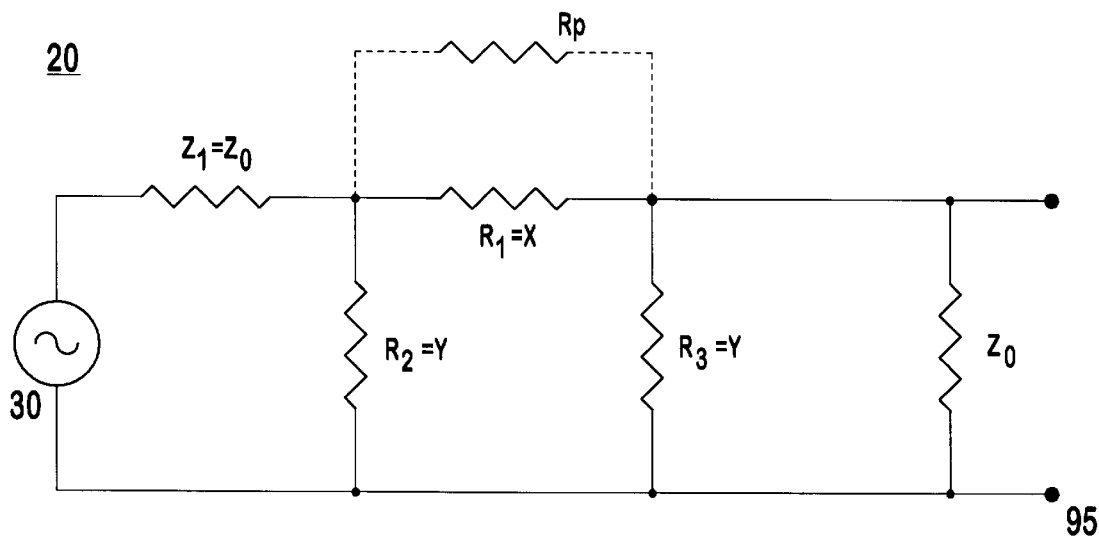
FIG. 4 is schematic diagram of a π attenuator.

The preferred embodiment of the present invention will be described with reference to the drawing figures where like numerals represent like elements throughout. Although the following is a description of a predistortion circuit coupled with an RF amplifier, those of skill in the art should recognize that the description is equally applicable to a postdistortion circuit coupled with an RF amplifier.

The transfer function of an RF amplifier with no second order distortion is in the form of:

$$V_{out} = k_1 v_{in} - k_3 v_{in}^3 \qquad \text{Equation (1)}$$

The negative sign for $k_3$ represents the saturation phenomena. The output signal will be compressed at both sides when the signal swings from positive to negative. For an example of a typical CATV RF amplifier with 18 dB gain and an input power level of 30 dBmv/channel for 77 channels, the transfer function is:

$$V_{out} = 7.8 v_{in} - 0.056 v_{in}^3 \qquad \text{Equation (2)}$$

The input average peak voltage will be 0.38 volts and the output average peak voltage will be 3 volts if the RF amplifier is linear. Due to the nonlinearity of the hybrid, the final average peak amplitude is:

$$V_{abs} = 3 - 0.003 \qquad \text{Equation (3)}$$

Equation 3 demonstrates that due to the nonlinearity of the RF amplifier, the output average voltage is compressed by 1 thousandth at the amplitude peak. In other words, the output signal of the RF amplifier has been compressed by 0.0086 dB at its amplitude peak.

The remedy for this distortion is using the instant voltage nonlinear controlled attenuator in accordance with the present invention. This attenuator provides attenuation of 0.0086 dB at the RF signal peak. As will be explained in detail hereinafter, the present invention takes advantage of the nonlinearity of the current flowing through two diodes coupled together to instantly generate a correction voltage. When the nonlinear controlled attenuator is cascaded with an RF amplifier, the output signal of the combination of attenuator and RF amplifier will be linearized.

The present invention will be described with reference to FIG. 4, whereby a π attenuator network 20 is shown. The network 20 comprises a selected configuration of resistors $Z_1$, $R_1$, $R_2$, $R_3$, $Z_0$, $R_p$. The signal source is input at signal input 30 and the output of the attenuator network 20 is seen across the output 95. $Z_1$ is the source of internal impedance which should be equal to the system impedance $Z_0$, which is seen across the output 95. In an embodiment of the invention for use with a CATV system, the impedance values $Z_1$ and $Z_0$ are equal to 75 Ohms. Three of the resistors $R_1$, $R_2$, $R_3$ form a π attenuator configuration. Preferably, the values (Y) of resistors $R_2$ and $R_3$ are equal, and substantially larger than the value (X) of resistor $R_1$. Resistor $R_p$ is connected in parallel with resistor $R_1$.

As one skilled in the art would clearly recognize, when the following condition is satisfied:

$$X = 2Z_0^2 Y/(Y^2 - Z_0^2) \quad \text{Equation (4)}$$

the attenuator network 20 is matched at input and output, from DC to very high frequencies. For one example of the attenuator when X=7.5 and Y=1.5 K, the power attenuation A for this attenuator network 20 is:

$$A = \left( \frac{2(YZ_0/(Y+Z_0)+X)Y(YZ_0/(Y+Z_0))}{\frac{(Y+X+YZ_0/(Y+Z_0))(X+(YZ_0/(Y+Z_0)))}{Z_0 + \frac{(YZ_0/(Y+Z_0)+X)Y}{Y+X+YZ_0/(Y+Z_0)}}} \right)^2 \quad \text{Equation (5)}$$

Under the condition when $Z_0 \ll Y$, (as is the case when X=7.5 and Y=1.5 K):

$$A \cong (2Z_0/(2Z_0+X))^2 \quad \text{Equation (6)}$$

$$A(dB) = 10 \lg A \quad \text{Equation (7)}$$

When X=7.5 and Y=1.5 k, A (dB)≅0.42 dB. This means the attenuator network 20 has very low insertion losses and a good frequency response. When X has a small variation due to the parallel of $R_p$, shown in FIG. 4, from Equation (6)

$$\text{Delta } A \text{ (dB)} \cong -8.68 \frac{\text{Delta } X}{2Z_0 + X} \quad \text{Equation (8)}$$

$$\text{Delta } X = \frac{XR_p}{X+R_p} - X = -\frac{X^2}{R_p} \quad \text{Equation (9)}$$

From Equation (9):

$$\text{Delta } A \text{ (dB)} \cong 8.68 \frac{X^2}{2Z_0 R_p} \quad \text{Equation (10)}$$

For example, If $R_p$=375 ohms then:

$$\text{Delta } A \text{ (dB)} \cong 8.68 \frac{(7.5)(7.5)}{(150)(375)} = 0.00868 \text{dB} \quad \text{Equation (11)}$$

Equation (11) shows that when $R_p$ (375 ohms) is in parallel with $R_1$ (7.5 ohms), the attenuation will be reduced by 0.00868 dB. This amount of attenuation change is needed for non-linear compensation for an amplifier. This example also shows that when the value of $R_p \gg R_1$, (i.e., when $R_p$ is 50 times larger than $R_1$), adding $R_p$ parallel with $R_1$ has almost no effect on the impedance match, and the voltage drop over the $R_p$ is mainly determined by the value of $R_1$.

However, if a linear resistor $R_p$ is used in the attenuator network 20, there will be no distortion signal produced. The attenuator network 20 as shown is a linear device. In order for a distortion circuit to operate effectively, diodes are used to create a non-linear resistance. Preferably, Schottky diodes are utilized. At small current, diode current is exponentially proportional to the voltage across over the diode. Thus diodes can be used as a non-linear resistance. For non-linear applications, the amount of attenuation can be calculated as:

$$\text{Delta } A \text{ (dB)} = 8.68 \frac{X}{2Z_0} \frac{X}{R_p} = 8.68 \frac{X}{2Z_0} \frac{I_p}{I_1} \quad \text{Equation (12)}$$

Where $I_p$ is the current flow through $R_p$, (the non-linear resistance). $I_1$ is the current flow through $R_1$. Equation 12 provides the relationship of the attenuation change due to the current change in $I_p$. This equation is accurate over a broad frequency range. The relationship between the delta attenuation and a change in current is still valid when the resistance is a non-linear resistor. Accordingly, Equation 12 provides a good estimation of how much non-linear current is required for predistortion or postdistortion purposes.

Figure 5:
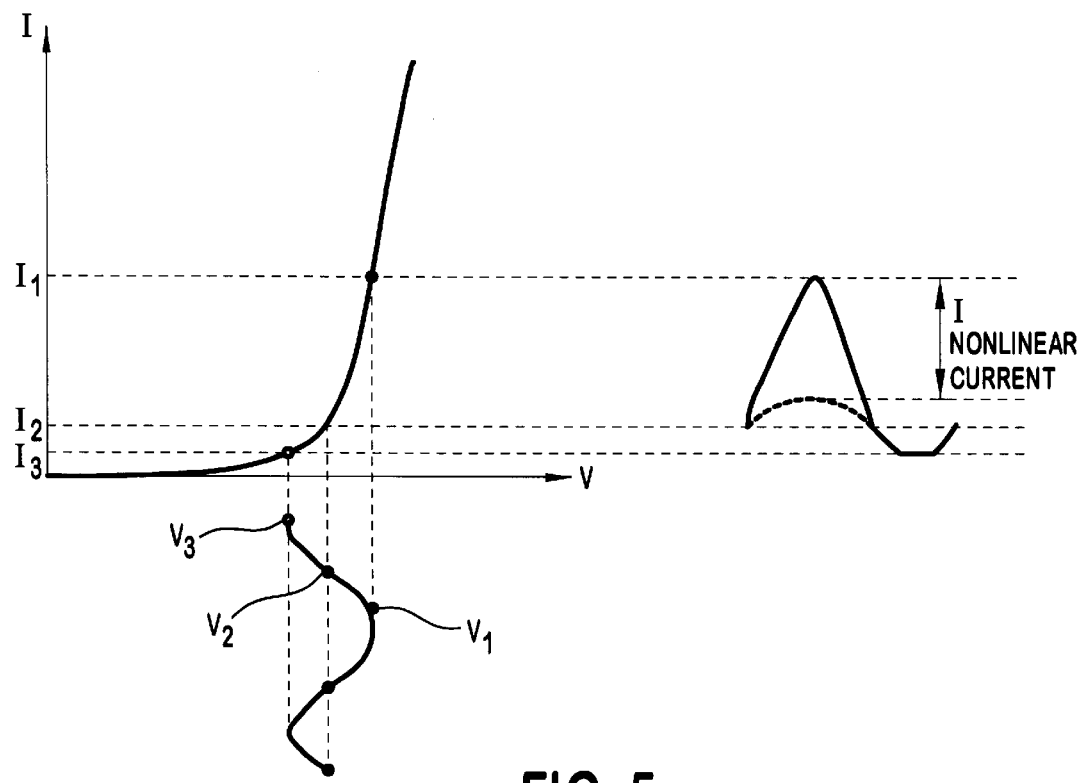
FIG. 5 is a signal diagram of the diode non-linear current caused by the input voltage.

Referring to FIG. 5, when the input sinusoidal voltage wave changes from $V_1$ to $V_2$ to $V_3$, the output current changes from $I_1$ to $I_2$ to $I_3$ respectively. The non-linear current used for order correction is:

$$I_{nonlinear} \cong I_1 - 2I_2 + I_3 \quad \text{Equation (13)}$$

From Equation 12, the non-linear current needed is:

$$\text{Delta } A_{nonlinear\ correction}(\text{dB}) \cong 8.68 \frac{X}{2Z_0} \frac{I_{nonlinear}}{I_{output}} \quad \text{Equation (14)}$$

Only non-linear current will be useful for predistortion or postdistortion purposes. Equation 14 can be rewritten in the form of:

$$\text{Delta } A_{nonlinear}(\text{dB}) = 8.68 \frac{I_{nonlinear\ eff}}{I_{output}} \quad \text{Equation (15)}$$

$$I_{nonlinear\ eff} \cong \frac{I_{nonlinear}}{R_1/(2Z_0)} \quad \text{Equation (16)}$$

Figure 6:
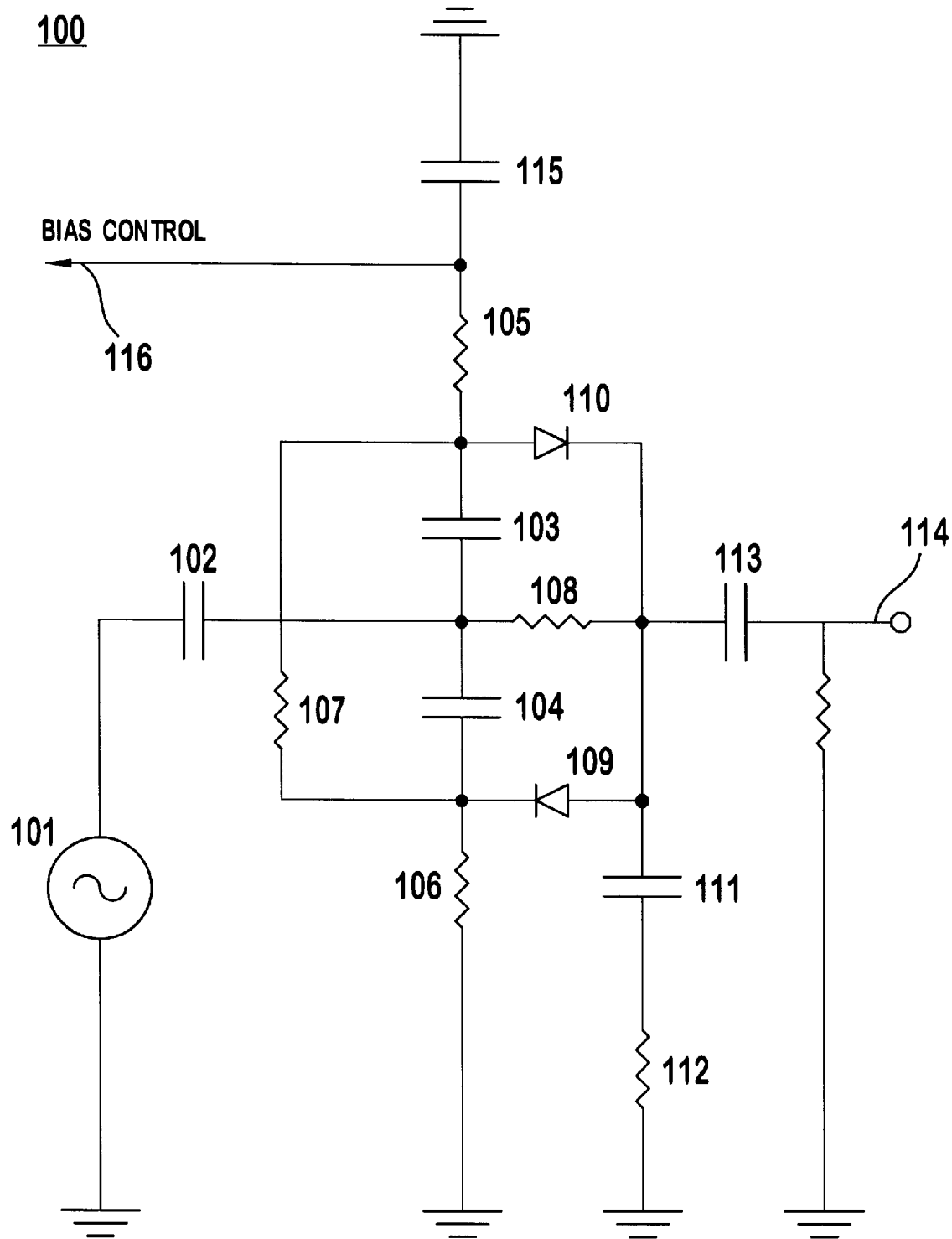
FIG. 6 is a schematic diagram of the preferred embodiment of the distortion generator of the present invention.

Accordingly, $I_{nonlinear\ eff}$ in Equation 15 is the effective non-linear current going to the output port 114 which is shown in FIG. 6. $I_{output}$ in Equation 15 is the total current that goes to the output port 114. Equation 16 shows that only a small part of the non-linear diode current is effectively being used for correction.

The π attenuator network 20 has low insertion loss and the voltage drop of the input voltage on $R_1$ (shown in FIG. 4) is proportional to the input voltage. This voltage may be used to drive a pair of diodes to produce non-linear current. The non-linear current flowing in the diodes will cause an attenuator to provide less attenuation at larger RF amplitudes, (i.e. when the input signal has a higher power). This may be used to compensate for the signal compression caused by amplification. Because of the relatively high value of the diode's non-linear resistance, the match of the attenuator network is almost unchanged. This match will not be changed even over temperature. Additionally, frequency response over multi-octave frequency bands is favorable.

Referring to FIG. 6, the preferred embodiment of the attenuator 100 for predistortion and postdistortion is shown. The attenuator 100 of the present invention includes several additional components that modify a traditional π attenuator to achieve significantly better performance over a wide frequency and temperature range. The attenuator 100 has an input port 101, an output port 114 and a bias control port 116. The attenuator 100 may be used in a predistortion configuration with an amplifier or in a postdistortion configuration. For a predistortion configuration, the output port 114 is connected to the input of an amplifier. For the postdistortion configuration as shown in FIG. 6, an output signal generated by an amplifier, is applied to the input port 101. The attenuator 100 includes resistors 105, 106, 107, 108, 112; capacitors 102, 103, 104, 111, 113, 115; and diodes 109, 110.

The function of the resistors 105, 106, 107, 108, 112 and the capacitors 102, 103, 104, 111, 113, 115 is to form a modified π attenuation network in comparison to the π attenuation network 20 shown in FIG. 4. The capacitors 102, 103, 104, 111, 113, and 115 are also used for DC blocking and AC coupling. From an AC standpoint, the parallel combination of resistors 105 and 106 is functionally equivalent to resistor $R_2$ of FIG. 4. Preferably, the values of resistors 105 and 106 should be chosen such that the parallel combination is equivalent to the value of resistance of resistor 112, (i.e. $((R_{105}*R_{106})/(R_{105}+R_{106}))=R_{112}$). Resistor 108 is functionally equivalent to resistor $R_1$ of FIG. 4; and the in-series combination of resistor 112 and capacitor 111 is functionally equivalent to resistor $R_3$ of FIG. 4. The value of resistor 107 has no effect on signal attenuation.

The other function for resistors 105, 106, and 107 is to supply a DC bias to the diodes 109, 110. The diodes 109, 110 are first connected in series; and the series combination is connected to resistor 107 in parallel. Because resistor 107 has a low resistance value and is in parallel with the diodes 109, 110, the voltage drop across the diodes 109, 110 will be primarily determined by the resistance of resistor 107. If the current flow in resistor 107 is much more than the current flow in the diodes 109, 110 the voltage drop across the diode 109, 110, will be very stable and will be insensitive to the presence or absence of a signal at the input port 101.

The integrated functions of signal attenuation and diode bias supply avoid any parasitic effects due to the introduction of additional bias circuitry. This permits a high frequency response and a favorable impedance match.

From an DC perspective, resistor 107, in parallel with capacitors 103 and 104, provides a dissipative circuit to the capacitors 103, 104. Therefore, resistor 107 will discharge the accumulated electric charge of connected capacitors 103, 104 in every AC cycle.

Diode 109 is connected to resistor 108 through capacitor 104 while diode 110 is connected to resistor 108 through capacitor 103. Diode 109 is responsible for the RF distortion correction during the negative portion of the AC cycle, while the diode 110 has the same function during the positive half of the AC cycle. The non-linear current of diode 109 charges capacitor 104, and the non-linear current of diode 110 charges capacitor 103. Due to the configuration of the circuit, the voltage produced on capacitors 103 and 104 have the same value but different signs. The small resistance from resistor 107 connected to the capacitors 103, 104 discharges the accumulated electric charge during every AC cycle. As a result, there is no voltage drop across the capacitors 103, 104. This permits the diode 109, 110 to provide the largest non-linear current for the correction purpose.

The present invention has several unique advantages over the prior art. Due to its symmetric structure, the attenuator 100 produces only odd order distortion. Consequently, the circuit does not degrade the second order performance of an NLD. The attenuator 100 also uses two low series resistances 107, 108. From a DC perspective, resistor 107 significantly improves the correction efficiency and reduces the susceptibility to ambient temperature effects. From an AC perspective, resistor 108 provides for distortion correction with low insertion losses. Due to the attenuator 100 design, the voltage drop across resistor 108 fully loads the diodes 109, 110 even under non-linear operation of the diodes 109, 110. As a result, maximum non-linear current is utilized for correction purposes. Finally, proper phasing of the distortion signals is inherent in the design, thereby avoiding additional phase circuitry and delay lines. This permits a circuit design which is much less complex and results in a compact and robust design.

Table 1 provides a listing of the components shown in FIG. 6. However, one skilled in the art would clearly recognize that the values shown in Table 1 are only for explanatory purposes, and should not be considered to be limiting to the invention. For example, the value of resistor 108 may range from approximately 2 Ω to 30 Ω. Likewise, the value of resistor 107 may range from approximately 100 Ω to 3000 Ω.

TABLE 1

| COMPONENT | VALUE OR IDENTIFICATION |
| --- | --- |
| 102 | 0.1 μf |
| 103 | 0.1 μf |
| 104 | 0.1 μf |
| 105 | 6 KΩ |
| 106 | 6 KΩ |
| 107 | 330 Ω |
| 108 | 7.5 Ω |
| 109 | HP HSMS-2822#L30 |
| 110 | HP HSMS-2822#L30 |
| 111 | 0.1 μf |
| 112 | 3 KΩ |
| 113 | 0.1 μf |
| 114 | 75 Ω |
| 115 | 0.1 μf |

As previously described, the attenuator 100 uses the non-linear current produced by the diodes 109, 110 to compensate for the voltage compression caused by an NLD. As shown, the attenuator 100 comprises capacitance, resistance and two diodes. The diodes are the only components that are sensitive to temperature change and the only components that require correction during operation over a wide temperature range. There are three factors which must be taken into consideration when operating the attenuator 100 over a wide temperature range:

1) The diode operating current will change if the bias voltage remains constant while the ambient temperature changes. Under the same input voltage swing at the input port 101 and the same bias voltage, more non-linear diode current will be created as the ambient temperature rises.

2) When the ambient temperature rises, the diode will produce less non-linear correction current for the same input signal voltage and the same diode bias current.

3) NLDs typically exhibit more distortion as the ambient temperature rises. Accordingly, a higher diode non-linear current is required for correction of the greater distortion.

All of the temperature effects experienced by the attenuator 100 are related to the bias voltage. Some of the effects are additive while others are subtractive. However, the result is that for a given temperature, there will be an optimum bias voltage to produce the proper correction output. Proper temperature correction will be achieved when there is a predefined change of bias voltage versus temperature.

Figure 7:
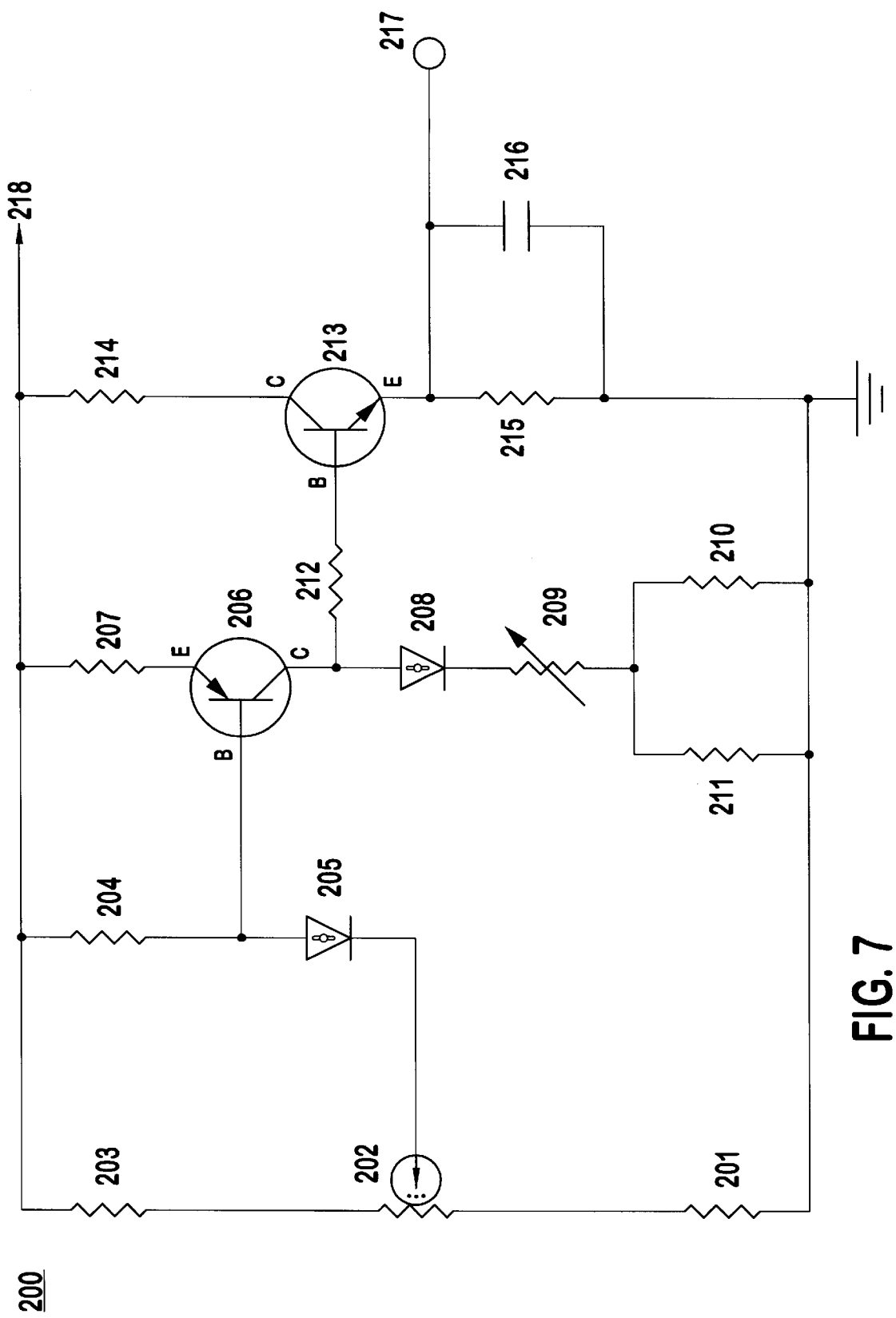
FIG. 7 is a schematic diagram of the temperature compensation circuit.

Referring to FIG. 7, the preferred embodiment of the temperature compensation circuit 200 is shown. The temperature compensation circuit 200 controls the bias of the diodes 109, 110 (shown in FIG. 6) for optimum compensation of the distortion. As shown, the temperature compensation circuit 200 comprises two transistors 206, 213; a capacitor 216; nine resistors 201, 202, 203, 204, 207, 209, 210, 214, 215; two diodes 205, 208; and a negative temperature coefficient thermistor 211.

The negative temperature coefficient thermistor 211 is coupled in parallel with resistor 210 to form a linearized resistance, which is correlated to a change in temperature. A PNP transistor 206 provides a constant current source through its collector to the linearized resistor combination 210, 211. The constant current provided by the PNP transistor 206 induces a linearized voltage change across the resistor combination 210, 211 as the temperature changes. By adjusting the value of the variable resistor 202, the amount of constant current through the PNP transistor 206 can be changed. Therefore, the voltage swing over temperature can be changed. The constant current also passes through the variable resistor 209, thereby creating a constant voltage drop that is used as a starting bias point for bias voltage adjustment. By selectively adjusting the resistance of resistors 202 and 209, any combination of voltage swing and starting bias voltage can be obtained. An NPN transistor 213, which is an emitter follower transistor, provides the control bias voltage from line 217 through line 116 to the attenuator 100, as shown in FIG. 7. The two diodes 205 and 208 are used to compensate for the junction voltage of the two transistors 206, 213 which change over temperature.

Table 2 provides a listing of the components shown in FIG. 7. However, one skilled in the art would clearly recognize that the values shown in Table 2 are only for example, and should not be considered to be limiting to the invention.

TABLE 2

| COMPONENT | VALUE OR IDENTIFICATION |
| --- | --- |
| 201 | 16 KΩ |
| 202 | 3.3 KΩ |
| 203 | 4.7 KΩ |
| 204 | 50 KΩ |
| 205 | 1N4148 |
| 206 | 2N3906 |
| 207 | 2 KΩ |
| 208 | 1N4148 |
| 209 | 1.5 KΩ |
| 210 | 2 KΩ |
| 211 | DKE 402N10 |
| 212 | 100 Ω |
| 213 | 2N3904 |
| 214 | 100 Ω |
| 215 | 3 KΩ |
| 216 | 50 µf |

It should be recognized that the present invention provides an instant voltage controlled non-linear attenuator design combined with a bias supply for optimum non-linear correction efficiency and bias temperature stability. Even if the temperature compensation circuit 200 as disclosed herein is not utilized, the preferred embodiment of the present invention provides adequate distortion correction over a broad temperature range. When the temperature compensation circuit 200 is utilized, the distortion compensation results can be further improved. Accordingly, a trade off between the performance of the compensating circuit and the complexity of the circuit must be weighted.

The present invention provides for correction of odd-order phase distortion. Third order distortion is dominant because it has the largest amplitude at the output of the RF amplifier; whereas higher odd-order distortions decrease in amplitude rapidly, making them less relevant to the distortion correction problem. Although the foregoing examples describe third order distortion due to the large difference in amplitude between third and higher odd-order distortion, the circuit is relevant to all odd-order correction and cancellation.

Figure 8:
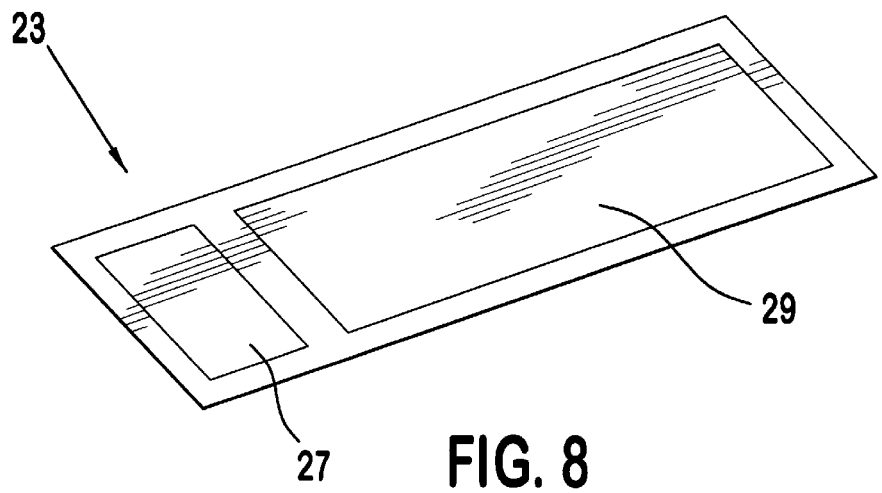
FIG. 8 is a schematic diagram of a PC board incorporating a distortion circuit coupled to an RF amplifier.

Referring to FIG. 8, the preferred embodiment of the present invention includes a distortion circuit 27 and an amplifier circuit 29 coupled on a single printed-circuit (PC) board 23. It should be recognized by those of skill in the art that there are many types and configurations of RF amplifier circuits that may be utilized in accordance with the teachings of the present invention. This distortion circuit is device independent. That is, its implementation may occur in a single ended RF amplifier, a push-pull amplifier or a power doubler device including pre and post amplifiers. The topology is also irrelevant to the implementation of the circuit. It may be used in all silicon, all GaAs, or in a combination thereof. Implementation for the above selected configuration is made by adjusting resistor 108 and the bias voltage applied to the bias control point 116 to match the distortion generated by the selected configuration. For example, the RF amplifier circuit 29 may be silicon cascode, silicon darlington, GaAs cascode or a combination of GaAs and silicon in a cascode configuration.

Power level is also irrelevant as this circuit may appear as a pre- or post-amplifier device. In addition, it may be used to correct both RF amplifier distortion, optical detector distortion, or a hybrid containing both RF and optical circuitry. One RF amplifier circuit 29, which is disclosed in U.S. patent application Ser. No. 09/236,175 entitled WIDEBAND LINEAR GAAS FET TERNATE CASCODE AMPLIFIER, is herein incorporated by reference.

Coupling of the circuits 27, 29 on a single PC board 23 results in several advantages. First, the positioning of the distortion circuit 27 with respect to the RF amplifier circuit 29 can be precisely determined during manufacture. Once the circuits 27, 29 are deposited onto the PC board 23, no adjustments to the circuits 27, 29 to account for a spatial change in the location of the respective circuits 27, 29 relative to each other are necessary. Second, this eliminates the expense and performance degradation introduced, when for example, delay lines are utilized to couple the distortion circuit 27 with the RF amplifier circuit 29.

Figure 9:
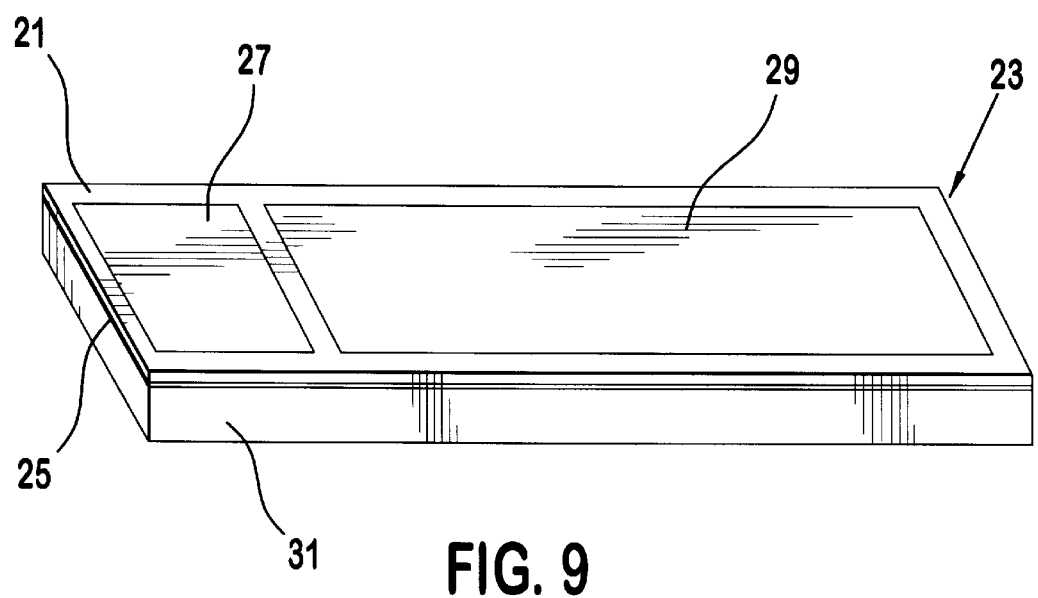
FIG. 9 is a perspective view of the PC board shown in FIG. 8.

The physical implementation of the preferred embodiment of the present invention is performed using surface mount devices (not shown) on a single side 21 of a double sided PC board 23 is shown in FIG. 9. A layer of copper is adhered to the second side of the PC board 23. This layer comprises a low inductance groundplane 25. As shown, the groundplane 25 is further coupled to a heat sink 31. In this manner, the groundplane 25 provides a convenient means for soldering the PC board 23 onto the heat sink 31.

Figure 10:
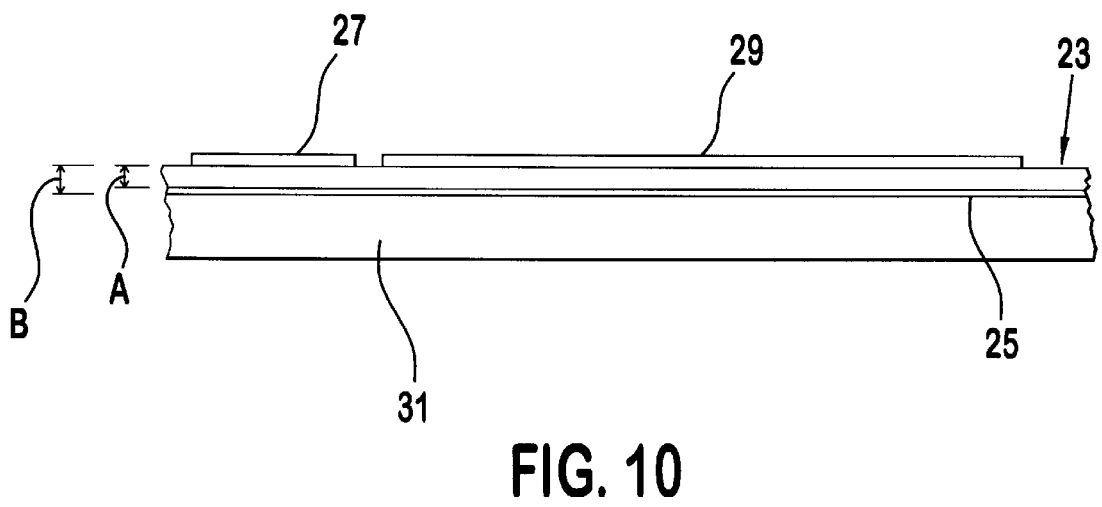
FIG. 10 is a side view of the PC board shown in FIG. 8.

Referring to FIG. 10, a side view of the PC board 23 is shown. The thickness of the PC board 23, the circuits 27, 29 and the groundplane 25 have been greatly exaggerated for explanation. Due to the proximity of the circuits 27, 29 to the groundplane 25, an electric charge may accumulate between the circuits 27, 29 and the groundplane 25 as illustrated by the distance A. Additionally, an electric charge may accumulate between the circuits 27, 29 and the heat sink 31, as shown by the distance B. The electric charges that accumulate create parasitic capacitances which ultimately degrade the performance of the RF amplifier circuit 29. Accordingly, it is paramount to reduce or eliminate these parasitic capacitances.

Figure 11:
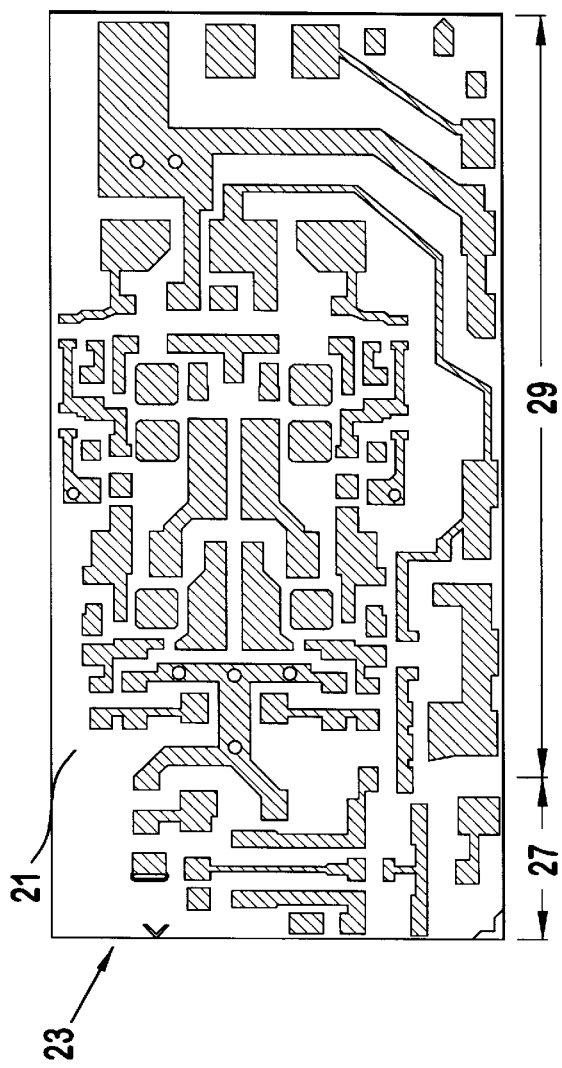
FIG. 11 is a top plan view of the foil template of the PC board.
Figure 12:
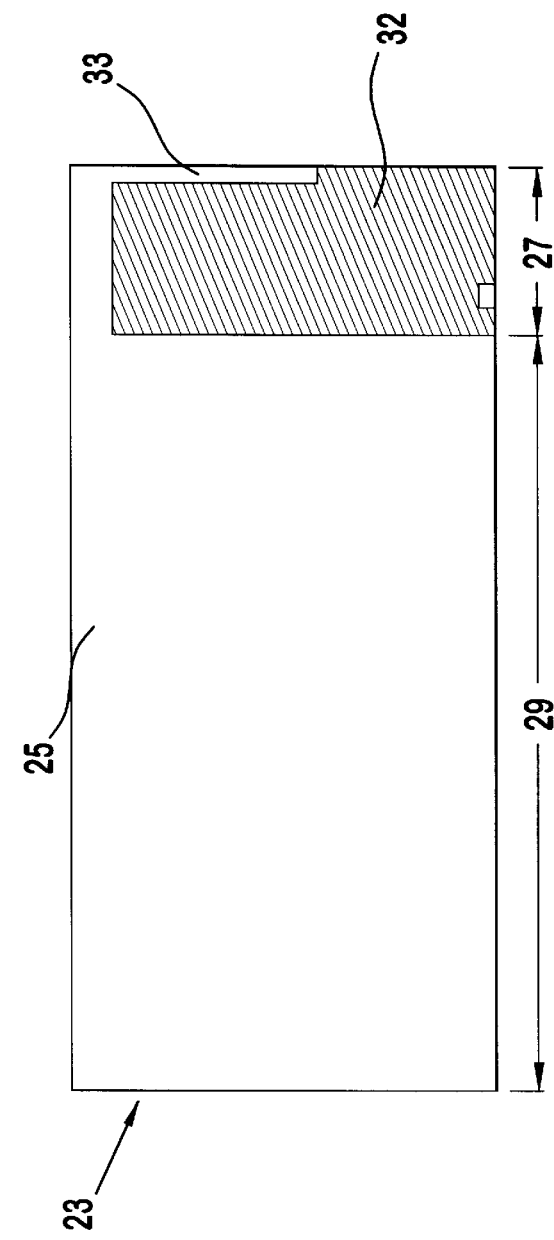
FIG. 12 is a bottom plan view of the copper groundplane of the PC board.

The PC board 23 includes foil regions for the conductive paths of the distortion circuit 27 and RF amplifier circuit 29. The foil template for the component side 21 of the PC board 23 is shown in FIG. 11. The foil template for the groundplane 25 side of the PC board 23 is shown in FIG. 12.

To protect from, and eliminate, excessive loss due to the parasitic effects of stray capacitance known to exist at the extended operating frequencies of the distortion circuit 27, a portion of the copper groundplane 25 is specifically removed under the distortion circuit 27. This is shown in FIG. 12 as the cross-hatched region 32. A small area 33 of copper is retained for maintaining ground continuity with the selectively configured heatsink 31.

Figure 13:
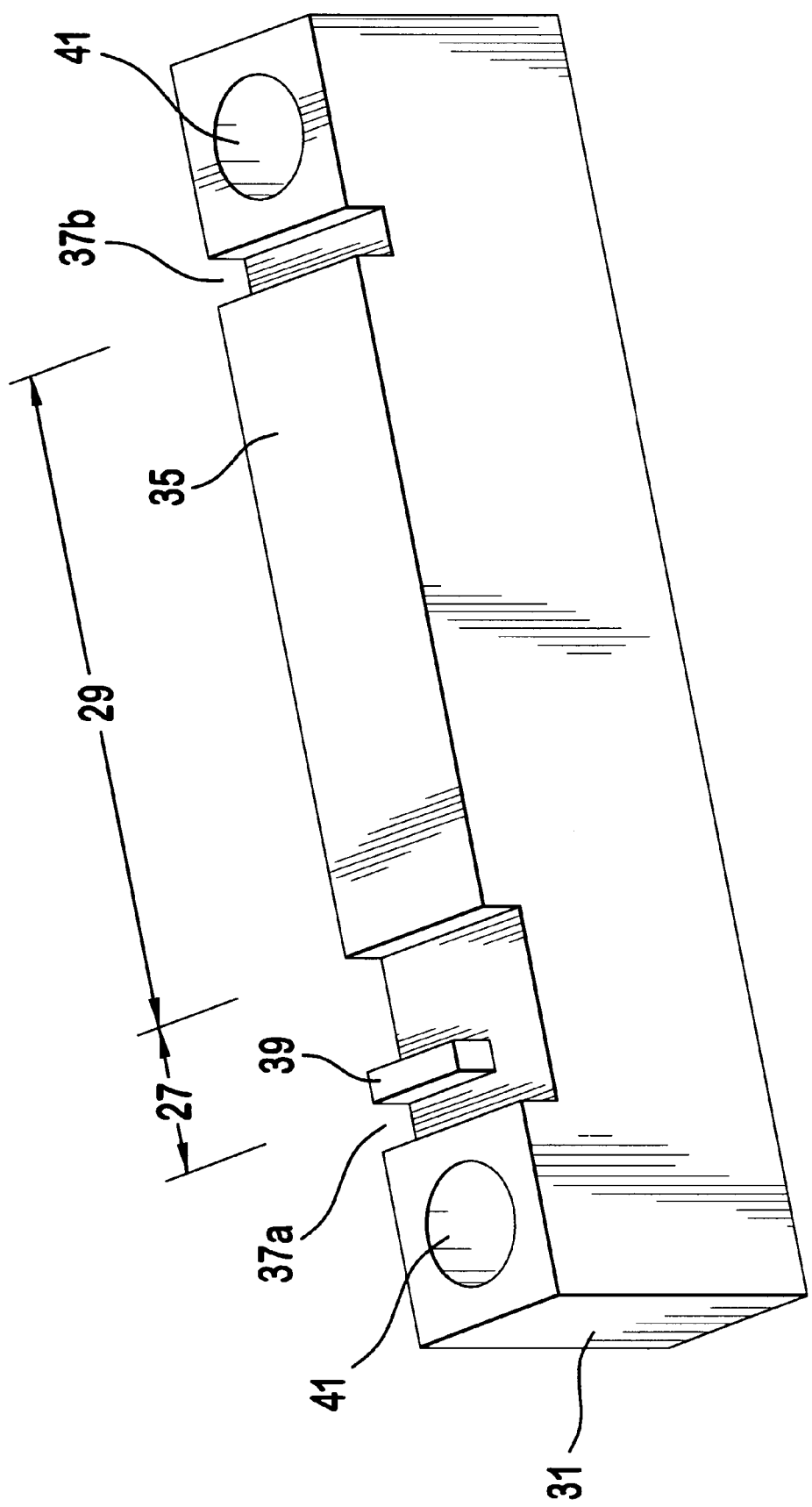
FIG. 13 is a perspective view of the heatsink of the present invention.

The heatsink 31 for the present invention is shown in greater detail in FIG. 13. The heatsink 31 is machined out of a thermally conductive material to complement the dimensions of the PC board 23 and the groundplane 25 foil pattern. The heatsink 31 can be any material which is thermally conductive, has a low electrical resistance and which includes at least one solderable surface. The top surface 35 of the heatsink 31 is selectively configured for matching correspondence with the distortion circuit 27 and the RF amplifier circuit 29 foil regions of the groundplane 25. A small area 39 of the top surface 35 of the heatsink 31 under the distortion circuit 27 provides support and attachment for the PC board 23, and also provides an additional ground path for the groundplane 25 small area 33, (shown in FIG. 12).

Figure 14:
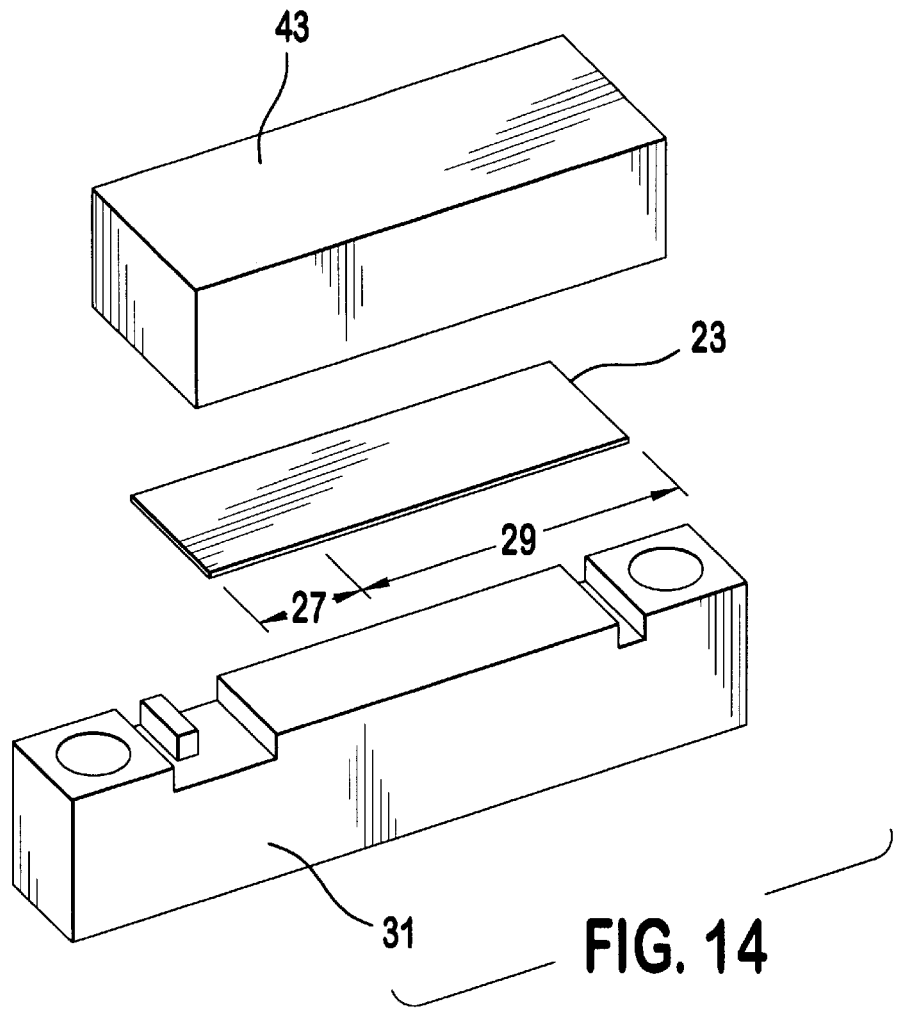
FIG. 14 is an exploded perspective view of the heatsink, PC board and cover of the present invention.
Figure 15:
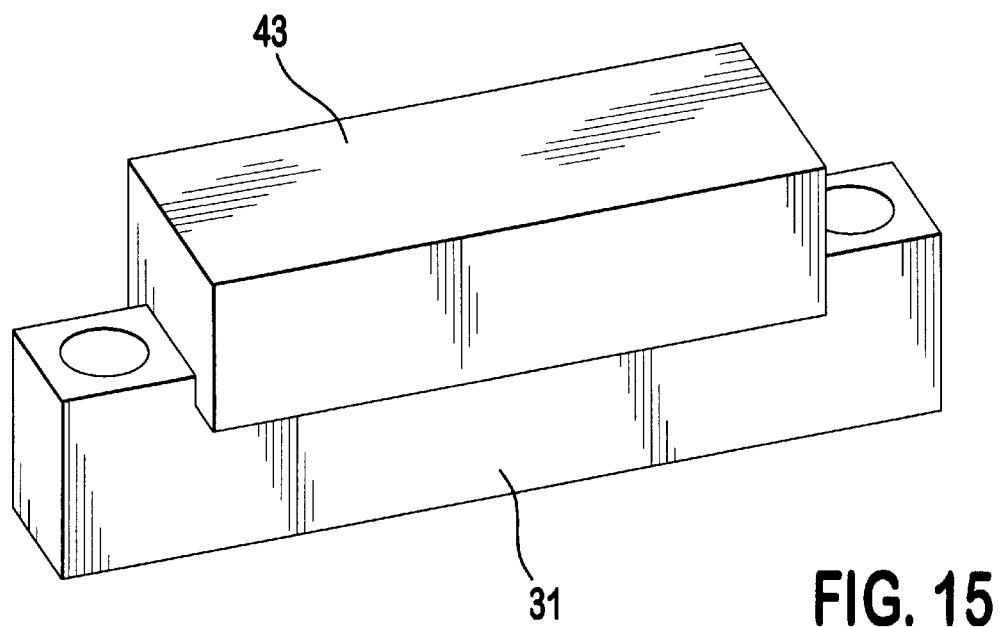
FIG. 15 is an assembled view of FIG. 14.

Two indented areas 37a, 37b on opposite sides of the top surface 35, define external cover 43 attachment areas of the PC board 23. This enables a cover 43 to protect the PC board 23 as shown in FIGS. 14 and 15 and protect against short circuits. Two external mounting holes 41 in the heatsink 31 permit attachment of the heatsink 31 to an internal thermal heatsinking surface of an environmental enclosure (not shown).

Figure 16:
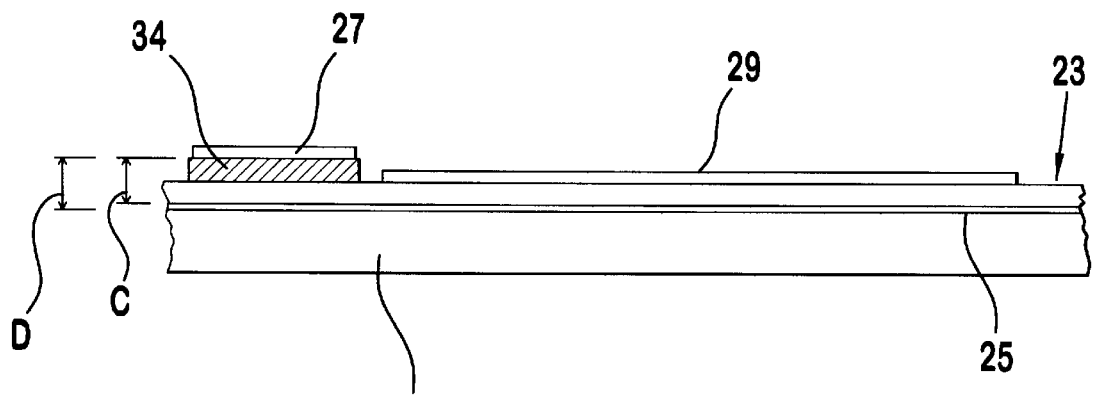
FIG. 16 is an alternative embodiment of the present invention.

Referring to FIG. 16, an alternative embodiment of the present invention is shown. In this embodiment, an additional non-conductive insert 34, such as an additional piece of PC board or a ceramic insert with a low dielectric constant, is inserted under the distortion circuit 27. This increases the distance C between the distortion circuit 27 and the groundplane 25 and the distance D between the distortion circuit 27 and the heatsink 31. As these distances are increased, the accumulation of charges, and the resulting parasitic capacitances, are significantly reduced.

Figure 17:
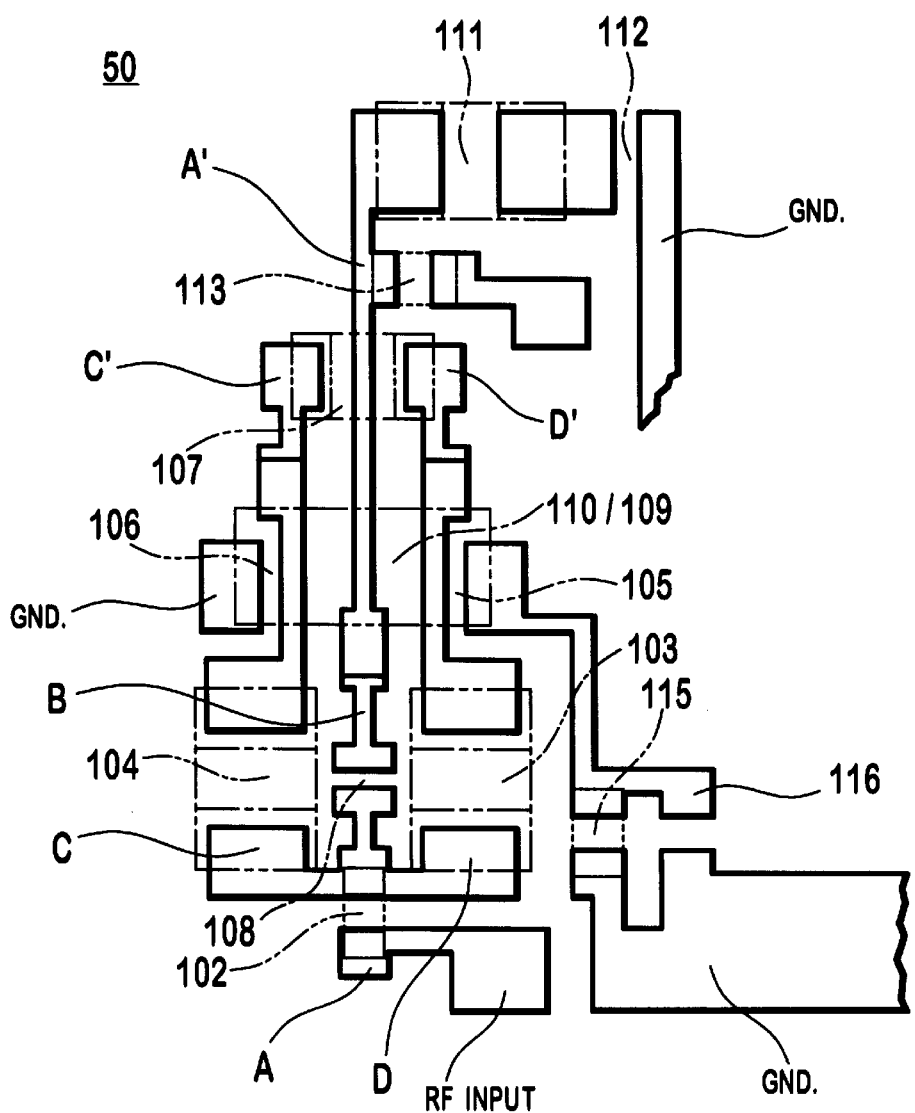
FIG. 17 is the spatial layout of the circuit components comprising the distortion circuit.

Referring to FIG. 17, the circuit layout 50 of the preferred embodiment of the distortion circuit 27 of the present invention is shown. The layout, or spatial relationship, between the components which comprise the distortion circuit 27 is critical. It should be noted that path C–C' and D–D' must be equal for efficient cancellation of unwanted distortion which may be introduced by the circuitry 27, such as second order harmonics or second order beats produced by the diodes 109, 110 and for efficient cancellation of the third order products of the RF amplifier circuit 29. Capacitor 111 and resistor 112 are required for efficiently matching the distortion circuit 27 with the RF amplifier circuit 29.

The transmission line A–A' provides for bandwidth adjustment and interstage matching. It is desirable to keep the length of the transmission line from A to A' as short as possible to reduce the insertion losses of the distortion circuit 27. It should also be noted that the distortion circuit 27 is symmetric about the transmission line A–A'. This ensures proper operation of the distortion circuit 27 and eliminates any undesired operating characteristics or unwanted distortions from being introduced by the distortion circuit 27. Finally, the distance between point B, which is the output of the diodes 109, 110, and the resistor 108 should be kept as short as possible to maintain cancellation at the highest frequencies. If this distance is too long, it could introduce a phase shift which will ultimately decrease the amount of distortion generated by the distortion circuit 27.

Figure 18A:
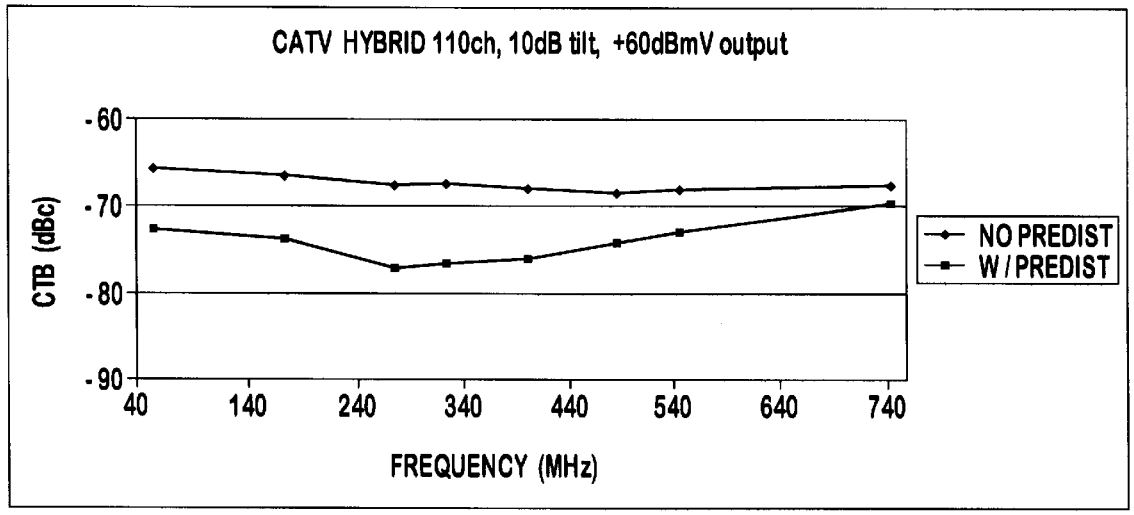
FIGS. 18A and 18B are graphs showing the improvement of an RF amplifier utilizing the teachings of the present invention.
Figure 18B:
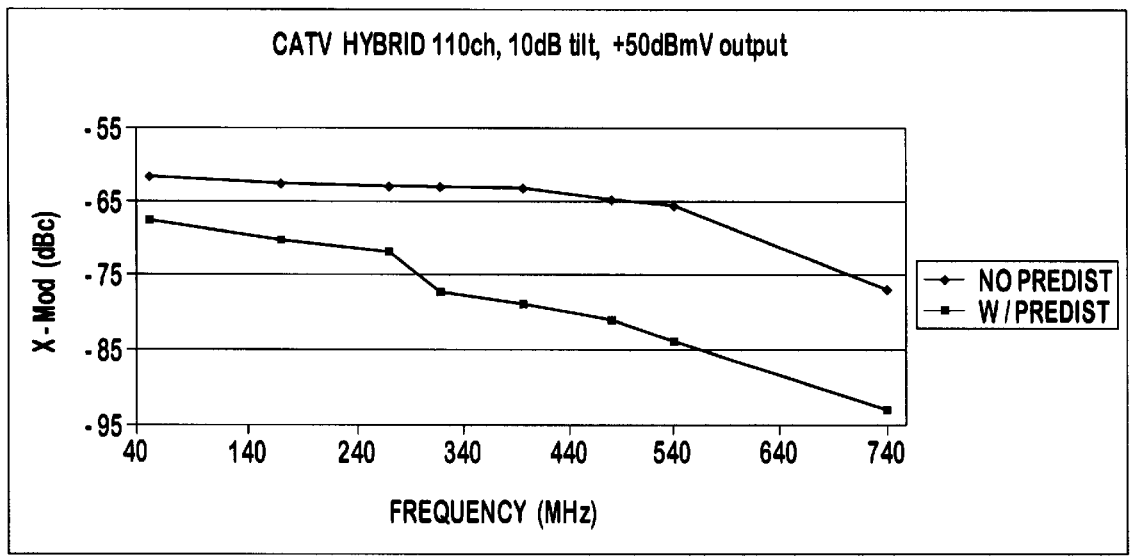

Referring to FIGS. 18A and 18B, the advantages of the present invention can be clearly shown with an improvement in the CTB and X-mod distortion output by the RF amplifier circuit 29. As shown in FIG. 18A, a dramatic improvement in the reduction of CTB distortion can be seen in the 200–540 MHz in an RF amplifier coupled to the distortion circuit 27 in a manner in accordance with the present invention. Furthermore, it should be noted that correction occurs across the entire bandwidth. Referring to FIG. 18B, an improvement in the amount of X-mod distortion is shown from the 90–640 MHz range; and is particularly dramatic in the 300–540 MHz range when the predistortion circuit 27 is coupled to an RF amplifier. Again, significant improvement can be seen across the entire bandwidth.

The preferred embodiment has been described using surface mount devices with an integral heatsink. Other construction methods may be employed adhering to the system and method of the claimed invention. While the present invention has been described in terms of the preferred embodiment, other variations which are within the scope of the invention as outlined in the claims below will be apparent to those skilled in the art.

What is claimed is:

1. A system for receiving an input RF signal and outputting an amplified RF signal comprising:
 a printed-circuit board having a first section electrically coupled via printed circuitry to a second section;
 a non-linear predistortion generator circuit defined in said first section for receiving said input RF signal and outputting a predistorted RF signal via said printed circuitry; and
 an RF amplifier circuit defined in said second section for receiving said predistorted signal via said printed circuitry and outputting said amplified RF signal; whereby the predistortion generator circuit corrects odd order phase distortion.

2. The system of claim 1, wherein all of the circuitry of said printed-circuit board is disposed on a first side, and further comprising a conductive backplane associated with said second section and disposed on a second side of said printed-circuit board, the conductive backplane being coextensive with said second section such that the backplane does not extend to any portion of said second side which is opposite said first section.

3. The system of claim 1, wherein all of the circuitry of said printed-circuit board is disposed on a first side, and further comprising a heatsink associated with said second section and disposed on a second side of said printed-circuit board, the heatsink being coextensive with said second section such that the heatsink does not extend to any portion of said second side which is opposite said first section.

4. The system of claim 1, wherein all of the circuitry of said printed-circuit board is disposed on a first side, and further comprising a heatsink associated with said second section and disposed on a second side of said printed-circuit board.

5. The system of claim 4, wherein said heatsink comprises first and second portions; whereby said first portion is coextensive with, and contacts, said second side of said printed-circuit board opposite said second section, and said second portion is coextensive with, but does not contact, said second side of said printed-circuit board opposite said first section.

6. The system of claim 1, wherein said printed-circuit board comprises first and second sides and further comprising a conductive backplane or said second side associated with said second section, the conductive backplane being coextensive with said second section such that the backplane does not extend to any portion of said second side which is opposite said first section.

7. The system of claim 1, wherein said printed-circuit board comprises first and second sides and further comprising a heatsink coextensive with said second section.

8. The system of claim 1, wherein said printed-circuit board comprises first and second sides and further comprising a heatsink associated with said second section and disposed on said second side of said printed-circuit board.

9. The system of claim 8, wherein said heatsink comprises first and second portions; whereby said first portion is coextensive with, and contacts, said second side of said printed-circuit board opposite said second section, and said second portion is coextensive with, but does not contact, said second side of said printed-circuit board opposite said first section.

10. A system for receiving an input RF signal and outputting an amplified RF signal comprising:

a printed-circuit board having a first section electrically coupled via printed circuitry to a second section;

an RF amplifier circuit defined in said second section for receiving said input RF signal and outputting an uncorrected amplified RF signal via said printed circuitry; and a non-linear distortion generator circuit defined in said first section for receiving said uncorrected amplified RF signal and outputting said amplified RF signal; whereby the distortion generator circuit corrects odd order phase distortion.

11. The system of claim 10, wherein all of the circuitry of said printed-circuit board is disposed on a first side, and further comprising a conductive backplane associated with said second section and disposed on a second side of said printed-circuit board, the conductive backplane being coextensive with said second section such that the backplane does not extend to any portion of said second side which is opposite said first section.

12. The system of claim 10, wherein all of the circuitry of said printed-circuit board is disposed on a first side, and further comprising a heatsink associated with said second section and disposed on a second side of said printed-circuit board, the heatsink being coextensive with said second section such that the heatsink does not extend to any portion of said second side which is opposite said first section.

13. The system of claim 10, wherein all of the circuitry of said printed-circuit board is disposed on a first side, and further comprising a heatsink associated with said second section and disposed on a second side of said printed-circuit board.

14. The system of claim 13, wherein said heatsink comprises first and second portions; whereby said first portion is coextensive with, and contacts, said second side of said printed-circuit board opposite said second section, and said second portion is coextensive with, but does not contact, said second side of said printed-circuit board opposite said first section.

15. The system of claim 10, wherein said printed-circuit board comprises first and second sides and further comprising a conductive backplane on said second side associated with said second section, the conductive backplane being coextensive with said second section such that the backplane does not extend to any portion of said second side which is opposite said first section.

16. The system of claim 10, wherein said printed-circuit board comprises first and second sides and further comprising a heatsink coextensive with said second section.

17. The system of claim 10, wherein said printed-circuit board comprises first and second sides and further comprising a heatsink associated with said second section and disposed on said second side of said printed-circuit board.

18. The system of claim 17, wherein said heatsink comprises first and second portions; whereby said first portion is coextensive with, and contacts, said second side of said printed-circuit board opposite said second section, and said second portion is coextensive with, but does not contact, said second side of said printed-circuit board opposite said first section.

* * * * *